US010186970B2

(12) United States Patent
Fay et al.

(10) Patent No.: US 10,186,970 B2
(45) Date of Patent: Jan. 22, 2019

(54) SWITCHING AUDIO AMPLIFIER

(71) Applicant: Panasonic Automotive Systems Company of America, Division of Panasonic Corporation of North America, Peachtree City, GA (US)

(72) Inventors: Richard Dennis Fay, Newnan, GA (US); Jerry Alan Rathje, Peachtree City, GA (US)

(73) Assignee: Panasonic Automotive Systems Company of America, Division of Panasonic Corporation of North America, Peachtree City, GA (US)

( * ) Notice: Subject to any disclaimer, the term of this patent is extended or adjusted under 35 U.S.C. 154(b) by 0 days.

(21) Appl. No.: 15/901,666

(22) Filed: Feb. 21, 2018

(65) Prior Publication Data
US 2018/0254705 A1    Sep. 6, 2018

Related U.S. Application Data

(60) Provisional application No. 62/466,544, filed on Mar. 3, 2017.

(51) Int. Cl.
*H02M 3/158* (2006.01)
*H03F 3/21* (2006.01)
*H02M 1/42* (2007.01)

(52) U.S. Cl.
CPC ....... *H02M 3/1582* (2013.01); *H02M 1/4208* (2013.01); *H03F 3/21* (2013.01); *H02M 2001/4291* (2013.01)

(58) Field of Classification Search
CPC ............ H02M 1/4208; H02M 3/1582; H02M 2001/4291; H03F 3/21
See application file for complete search history.

(56) References Cited

U.S. PATENT DOCUMENTS

| 6,166,527 A | 12/2000 | Dwelley et al. | |
|---|---|---|---|
| 9,998,077 B2* | 6/2018 | Mehrabi | H03F 1/34 |
| 2015/0270810 A1* | 9/2015 | Martin | H03F 1/0233 330/10 |

* cited by examiner

*Primary Examiner* — Kyle J Moody
*Assistant Examiner* — Kevin H Sprenger
(74) *Attorney, Agent, or Firm* — Laurence S. Roach, Esq.

(57) ABSTRACT

An AC capable power amplifier arrangement is realized that includes a buck converter with a power inductor, two buck switches, and alternately a buck-boost converter using four switches, each driving an output polarity steering set of four switches. The polarity steering switches convey the converter output current to output terminals that connect to a load with a capacitor connected in parallel. A differential receiver is connected to the output terminals to provide negative feedback. A mixer receives an input voltage signal, an output of the differential receiver, and output from a triangle wave generator. A set of two comparators for buck amplifier conversion, or four comparators for buck-boost amplifier conversion, each receives an output of the mixer. Each of the comparators produces a respective output for driving the converter switches through simple steering logic interfaces between the comparators, the converter components and a polarity steering output stage.

35 Claims, 9 Drawing Sheets

SWITCHING AUDIO AMPLIFIER

CROSS-REFERENCE TO RELATED APPLICATION

This application claims benefit of U.S. Provisional Application No. 62/466,544 filed on Mar. 3, 2017, which the disclosure of which is hereby incorporated by reference in its entirety for all purposes.

BACKGROUND OF THE INVENTION

1. Field of the Invention

The present invention relates to signal amplification, and switching power modulation and control.

2. Description of the Related Art

It is known for an electronic circuit for producing an output voltage and current to a load to include a controller and multiple high current semiconductor switches. Further, if output voltages are desired to be of greater magnitude than the supply voltage may allow, a boost power converter may be used. The power converter may include one or more power inductors, with two controlled switches arranged to operate in a boost switch configuration. The controller may, based on parameters associated with applied input signal levels, and based on the load impedance, apply boost power in order to transfer more electrical energy from an input source of the power converter to the load in accordance with the requirement to recreate a sufficiently larger replica of the input signal.

A problem with common digital audio amplifier switching audio power output stages is that they can be electrically noisy because the most common Class A-D amplifier configuration delivers a significant amount of the switching carrier wave to the output terminals, especially at no-signal conditions. Class B-D amplification is better because no-signal transitions do not deliver current to the load, but rail-to-rail common mode transitions still radiate and burn power in the output filters. This causes energy loss as radio frequency noise and/or heat as well as added cost in filter components to suppress the radio frequency noise.

A further problem with similarly capable high-power boost mode switching power amplifiers is the need to optimize efficiency. Boost power supplies in these configurations can be required to track the amplifier voltage requirements for best efficiency related to output level. Lower amplifier supply voltages are preferred when smaller signals are applied to reduce power loss. This requires a means to control the voltage boost based on input signal amplitude while the DC-DC regulator provides a low output impedance to the amplifier to prevent unwanted switching ripple that may be presented to the output. This usually requires use of a shunt capacitor. This capacitor creates a further dilemma because it needs to be big enough to prevent power supply noise but small enough to move fast enough to stay up with and replicate large audio transients. To solve this problem, further complexity is needed to add an analog-to-digital converter and digital delay to the input signal path along with a level detector, and a control signal to enable the boost supply when needed.

Another common concern with two switch boost power systems is that these designs cannot reduce the amplifier supply voltage below the supply input voltage. Newer designs solve this problem by integrating buck capability with at least two more switches in the regulator architecture and can further improve performance by eliminating the slowing regulator output capacitor and employing a comprehensive cycle-by-cycle analysis in order to determine what operating mode will be employed next to best match the needs of precision current delivery. This design approach has resulted in a proliferation of extensive digital signal processing complexity as well as redundant power device use in order to get a plurality of possible selected operating modes to link to the converter and output stage in a manner that achieves delivery of high power and wide dynamic range.

SUMMARY OF THE INVENTION

The present invention provides a simple set of solutions to the above noted issues in execution of a power amplifier design which are better than solutions that have been previously developed. The primary core component of this design approach is a DC-DC buck regulator that uses a single comparator, single inductor, and two switching devices [See FIG. 1]. A simple feedback loop is realized. A triangle wave is mixed with the reference [Input] level, and a negative feedback signal. The resulting signal is applied to a comparator to create an amplitude-dependent pulse width, then applied to the N-channel power FETs driving an inductor. An output power diode is retained to ensure the output capacitor is never loaded with a discharged inductor.

This buck regulator system, designed for high power and high efficiency DC level shifting, is adapted for AC amplifier operation in four ways. First, the common output ripple shunting capacitor that is always used with all DC-DC regulators is made to be very small or is not used at all. Second, a common high current capability N-channel FET H-bridge amplifier output stage configuration is tied to the regulator output diode cathode. Next, a second comparator is added to the input architecture so that input voltages can be accommodated that are both positive and negative relative to a reference value. Finally, some simple steering logic is tied between the input comparators, power devices and the N-channel FET H-bridge [see FIG. 2]. An OR gate captures signals from either buck comparator and applies these signals to a push-pull set of switches to drive a power inductor in buck mode. The two comparator reference voltages are set apart from each other in relation to the triangle wave amplitude. The N-channel FET H-bridge drive architecture output stage is controlled with a unique modulation strategy that falls out of the simplicity of the architecture. The N-channel FET output H-bridge is used for polarity steering. At the beginning of each clock cycle the polarity of the output for that cycle is set for the duration of the cycle. A set-reset latch element provides the correct polarity for the output stage by sensing which comparator triggers. Then the polarity is set until another comparator event changes it at the next comparator event. Once the polarity is set, the Pulse Width Modulated (PWM) controlled regulator system will deliver current as a pulse in DCM [Discontinuous Conduction Mode], or continuous current in CCM [Continuous Conduction Mode]. When at zero input signal, the triangle wave is just a small amount larger than the effective voltage differential between the comparator reference voltages, and the set-reset signals will cause the output stage to commutate. This commutation effectively emulates low duty cycle class A-D amplifier modulation [See FIG. 7]. This functionality provides linearity across the extremely critical, very low voltage including the zero-crossing region of the amplifier output swing. When an input voltage is applied, the pulse widths offset as with a common class A-D amplifier to support the gain matched output signal replication that is naturally filtered by the inductor and a capacitor across the output terminals. The relatively low signal input amplitude when the output is commutating ensures that the inductor is in DCM. The load polarity should not reverse while the inductor is charged in CCM. The commutation of the output polarity at only low signal amplitudes also ensures that common switching carrier electromagnetic interference (EMI) is reduced. When the instantaneous wave form amplitude transitions out of this low level in order to replicate a larger half-cycle wave, one comparator stops receiving a signal, the duty cycle is effectively cut in half, and the DC conversion architecture acts as a traditional single polarity buck regulator following the input signal for the duration of the half-cycle [See FIG. 8]. Ripple at this higher-level buck region is at half the carrier frequency that is used for low level signal replication, further reducing and spreading the EMI spectrum. This signal controller approach ensures that only the DC regulator architecture needs to respond to amplitude related PWM signals instead of both the regulator and amplifier architecture with different complex drive systems, as is common practice.

In another embodiment, a boost function is added to the core buck regulator. For the regulator configuration, this is achieved with the addition of one more comparator with voltage level, and one more N-channel FET [boost] switch, [See FIG. 3]. The boost engagement level is designed to activate when the amplifier output voltage approaches the input power supply voltage. This reference level can track with the input power source voltage at a slightly reduced absolute value. The two comparator thresholds are set with the amplitude of the triangle wave, allowing for a cycle by cycle buck-boost function [See FIG. 9]. For the AC amplifier adaptation of this DC converter, the original buck amplifier architecture in FIG. 2 gets two more comparators, an added OR gate, and the added boost switch as mentioned before [See FIG. 4]. For a smooth transition, the effective boost comparator DC value must track with and below the supply voltage to ensure the buck-boost transition takes place before the source voltage is reached. In this buck-boost region, the EMI spectrum ripple again spreads, reducing the worst-case radiation levels. When the amplifier output level exceeds the input supply voltage level by some margin, the buck function will be expected to reach 100% duty cycle, and, as the input signal continues to rise, the boost function will continue to increase the supply and output voltage until it reaches maximum voltage capability.

As noted above, the simple drive architecture controls the output stage with a unique modulation strategy. The output N-channel FET H-bridge is only used for polarity steering. With the addition of Set-Reset latch commutation, it can emulate class A-D amplifier modulation, and is designed to do this at low levels. Once the polarity is set, the PWM controlled regulator system will deliver current as a pulse in DCM, or continuous current in CCM. This signal controller approach ensures that only the DC regulator architecture needs to respond to amplitude related PWM signals instead of both the regulator and amplifier architecture with different complex drive systems, as is common practice. With this simple modulation architecture, executable with nothing more than two operational amplifiers, a quad comparator, a triangle generator, and hex NOR gate, the above amplifier system can act as a common class A-D modulated amplifier at low levels [See FIG. 7], then as the output level increases, transition to a buck regulator function [See FIG. 8], then at still higher voltage, include a cycle by cycle buck-boost regulator function [See FIG. 9], and finally act as a boost regulator [See FIG. 6] with smooth linear feedback controlled transitions between each function. All this may be achieved without the support of a complex digital domain controller, delta sigma or quantizer modulation functions, mode selector block function, peak current computation or determination, A to D or D to A converters, or the use of an embedded analog power stage modality.

This invention should provide an extremely high efficiency integrated digital switching regulator and amplifier combination that relies on buck and boost converter principles of operation to realize a very simple low cost, high power audio amplifier for automotive and other applications.

An advantage of the present invention is that it may enable a core integrated circuit (IC) to be fabricated at lower cost and with fewer associated and required components.

Another advantage of the invention is that the intrinsic self-noise filtering architecture results in better electromagnetic compatibility (EMC) and associated radio frequency interference (RFI) of lower magnitude due to the lower commutating and ripple carrier amplitudes.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein.

DETAILED DESCRIPTION OF DRAWINGS

The embodiments hereinafter disclosed are not intended to be exhaustive or limit the invention to the precise forms disclosed in the following description. Rather the embodiments are chosen and described so that others skilled in the art may utilize its teachings.

Figure 1:
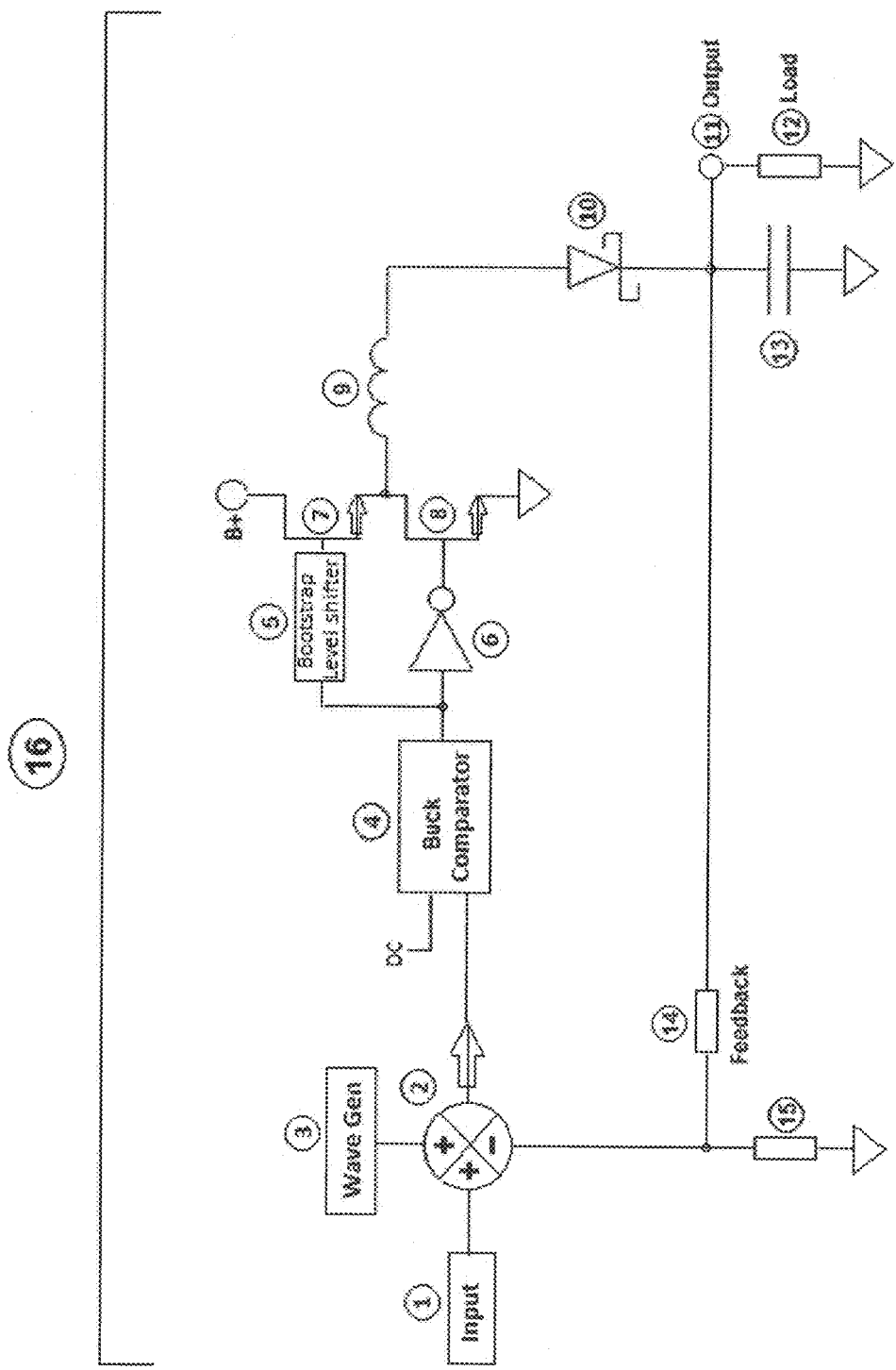
FIG. 1 is a schematic diagram of a simple buck regulator.

FIG. 1 illustrates a basic DC-DC buck switching regulator 16, a core sub-element of the present invention. In common regulator applications, the input 1 is a DC reference voltage. The mixer 2 mixes the input with a triangle wave generator 3 and a return negative feedback signal from the output 11, reduced appropriately with feedback resistors 14 and 15. A comparator 4 with a set DC level creates an amplitude dependent width pulse waveform, applied to N-channel FETs 7 and 8 through a boot strap level shifter conditioning element 5 and inverter 6 creating a push-pull output. Standard techniques are expected to avoid shoot-through, and for the bootstrap function to ensure adequate high side gate drive on switch 7. The N-channel FETs 7 and 8 provide current drive to inductor 9. Output is applied through power diode 10 to load 12 with parallel capacitor 13 in order to prevent the discharged inductor from loading the output capacitor 13 in DCM. This diode function can be emulated with a switch that is made to perform similarly with reduced power loss.

Figure 2:
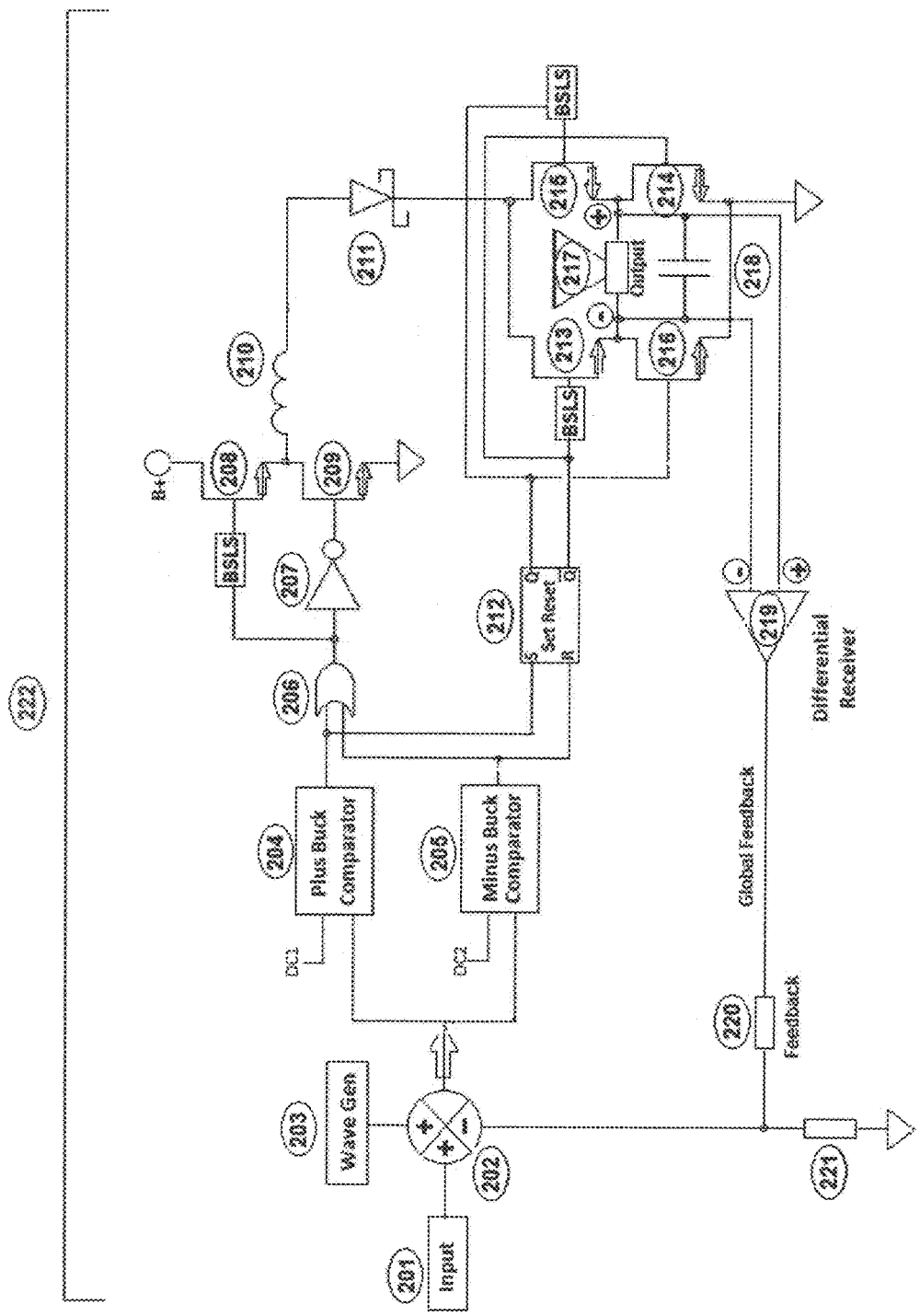
FIG. 2 is a block diagram of one embodiment of an audio power amplifier circuit developed from a buck regulator in FIG. 1, a unique architecture of the present disclosure.
Figure 7:
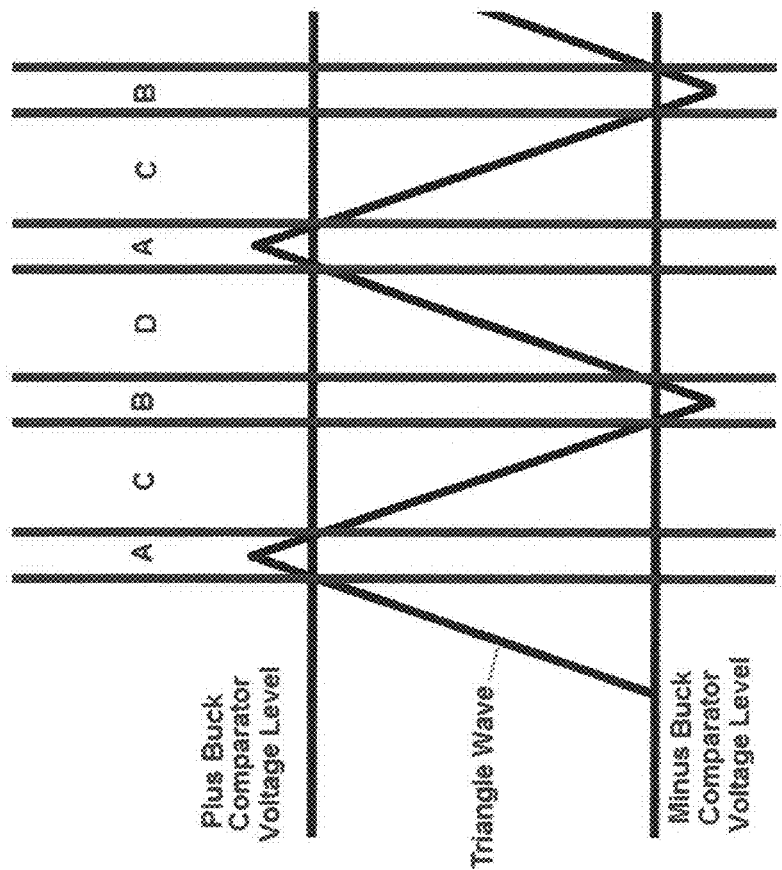
FIG. 7 is a plot showing a buck commutation switch status, a function of the power amplifier circuit from FIGS. 2 and 4 when operating at low level output.
Figure 8:
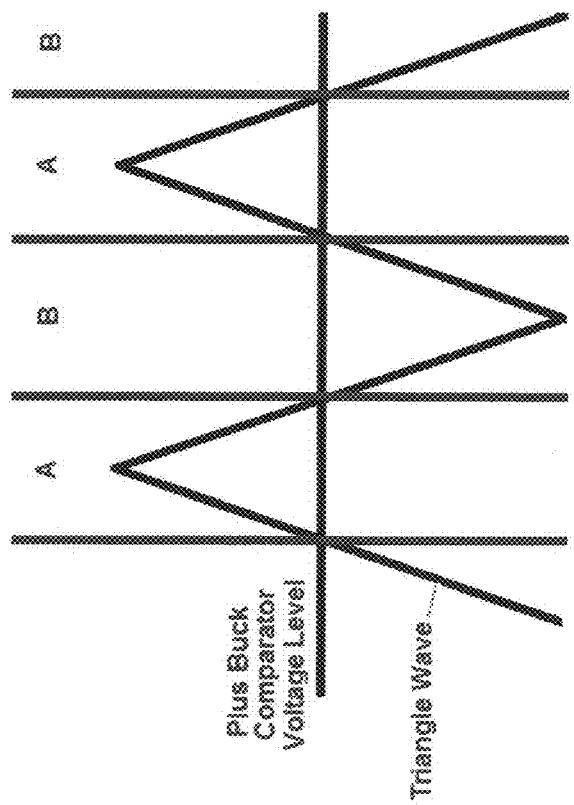
FIG. 8 is a plot showing a regulator switch status during a single cycle buck regulator function, a function of the power amplifier circuit from FIG. 2 and 4.

FIG. 2 illustrates a digital switching amplifier 222 that employs the regulator in FIG. 1, and is a core element of the present invention. In this configuration, the input 201 is a complex wave shape such as an audio signal. The input, triangle wave generator 203, and feedback signal from a differential receiver 219, reduced appropriately with feedback resistors 220 and 221, are applied to the mixer 202. Mixer output is applied to two comparators 204, and 205. These comparators are provided with DC references equidistant from the DC bias at the input level 201. The DC references are sized to be a bit smaller than the effective amplitude of the triangle wave [See FIG. 7] so that a low duty cycle, amplitude dependent width pulse waveform is generated at low levels with comparator outputs applied to N-channel FETs 208 and 209 through OR gate 206 and inverter 207. The OR gate captures signals from either buck comparator and applies these signals to the push-pull combination of switches 208 and 209 with the inverter to drive the power inductor 210 in buck mode. A BSLS [Boot Strap Level Shifter] interface ensures all high side FETs achieve adequate gate ON voltages when applied. The power inductor 210 is charged by switch 208, and switch 209 allows discharge of the inductor through the power diode 211 to the polarity steering output switches 213-216. The diode 211 allows conduction but prevents loading the discharged inductor across the output capacitor 218 and output load 217 in DCM. This diode function can be emulated with an N-channel FET switch that is made to perform similarly. Comparator signals are also applied to the Set-Reset latch element 212 that determines which polarity of the regulator output pulse is applied to the output terminals. The amplifier output stage is comprised of four N-channel FETs 213-216. These FETs 213-216 are activated by the Set-Reset latch, alternately in pairs to complete the current path to ground with the correct polarity. N-channel FETs 215 and 216 are set to ON with FETs 213 and 214 set to OFF for a positive applied current, and the opposite switch status is applied for a negative applied current. These switch settings steer the correct current polarity to the output terminals, load 217 and the capacitor 218.

Figure 3:
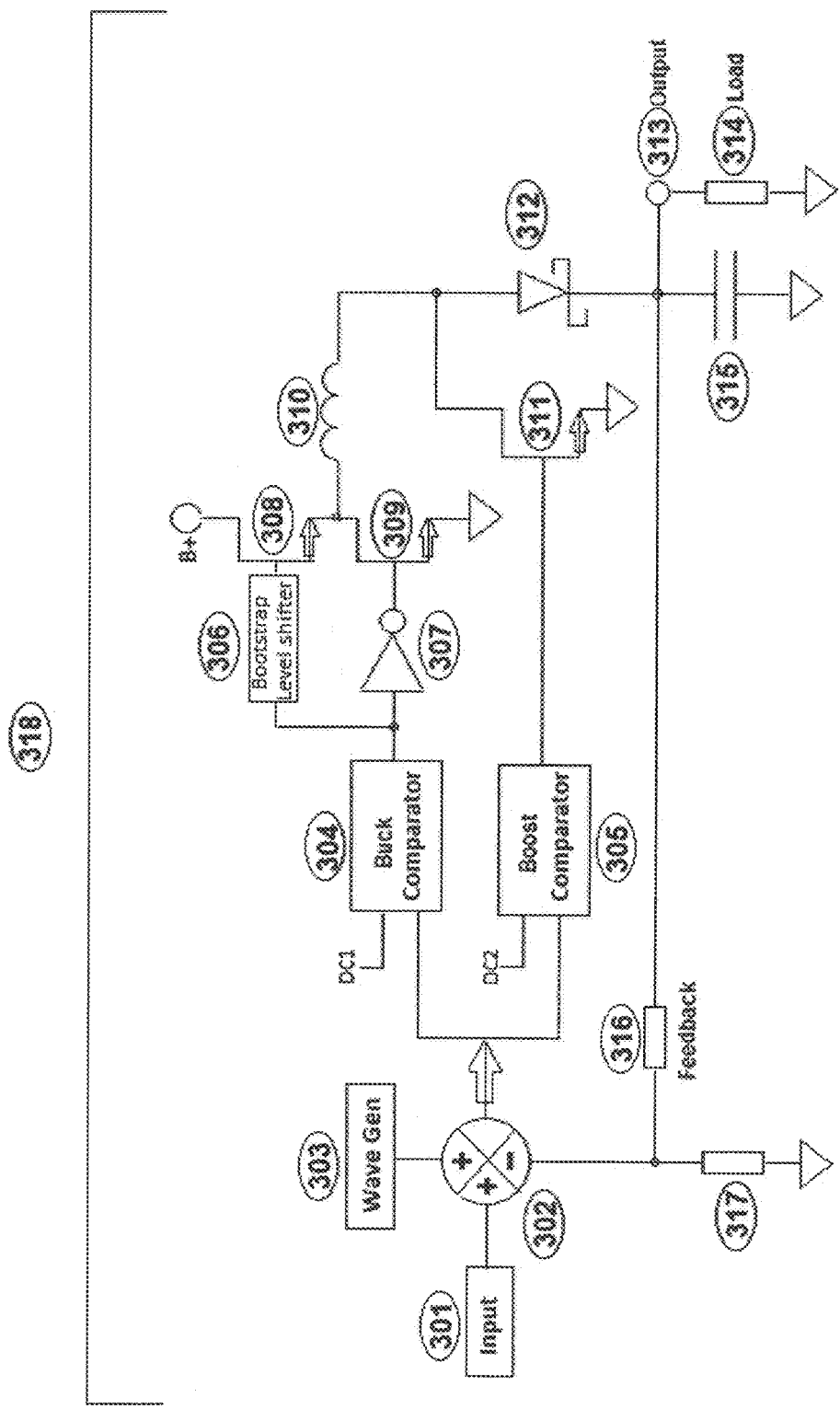
FIG. 3 is a schematic diagram of a simple buck-boost regulator developed from the buck regulator in FIG. 1.

FIG. 3 illustrates a buck-boost switching regulator 318 a core sub-element of the present invention that builds upon the buck regulator in FIG. 1. In common regulator applications, the input 301 is a DC reference voltage. The mixer 302 mixes the input with a triangle wave generator 303 and a return negative feedback signal from the output 313, reduced appropriately with feedback resistors 316 and 317. A buck comparator 306 with a set DC1 level creates an amplitude dependent width pulse waveform, applied to N-channel FETs 308 and 309 through boot strap level shifter element 306 and inverter 307 creating a push-pull output. Standard techniques are expected to avoid shoot-through, and for the bootstrap function to ensure adequate high side gate drive on N-channel FET switch 308. The FETs provide current drive to inductor 310. A second comparator engages a boost function at a higher threshold. The threshold of the second comparator tracks with the B+ power source at a lower absolute value to ensure the boost mode is engaged before the buck function voltage maximizes at the power source voltage in order to allow for smooth transition from buck to buck-boost. The boost comparator drives an added N-channel FET switch 311. This allows increased inductor charge and output voltages above the power source plus voltage. Output is applied from the inductor 310 through power diode 312 to the load 314 with parallel capacitor 315 in order to prevent the discharged inductor from loading the output capacitor 315 in DCM. This diode function can be emulated with a switch that is made to perform similarly.

Figure 4:
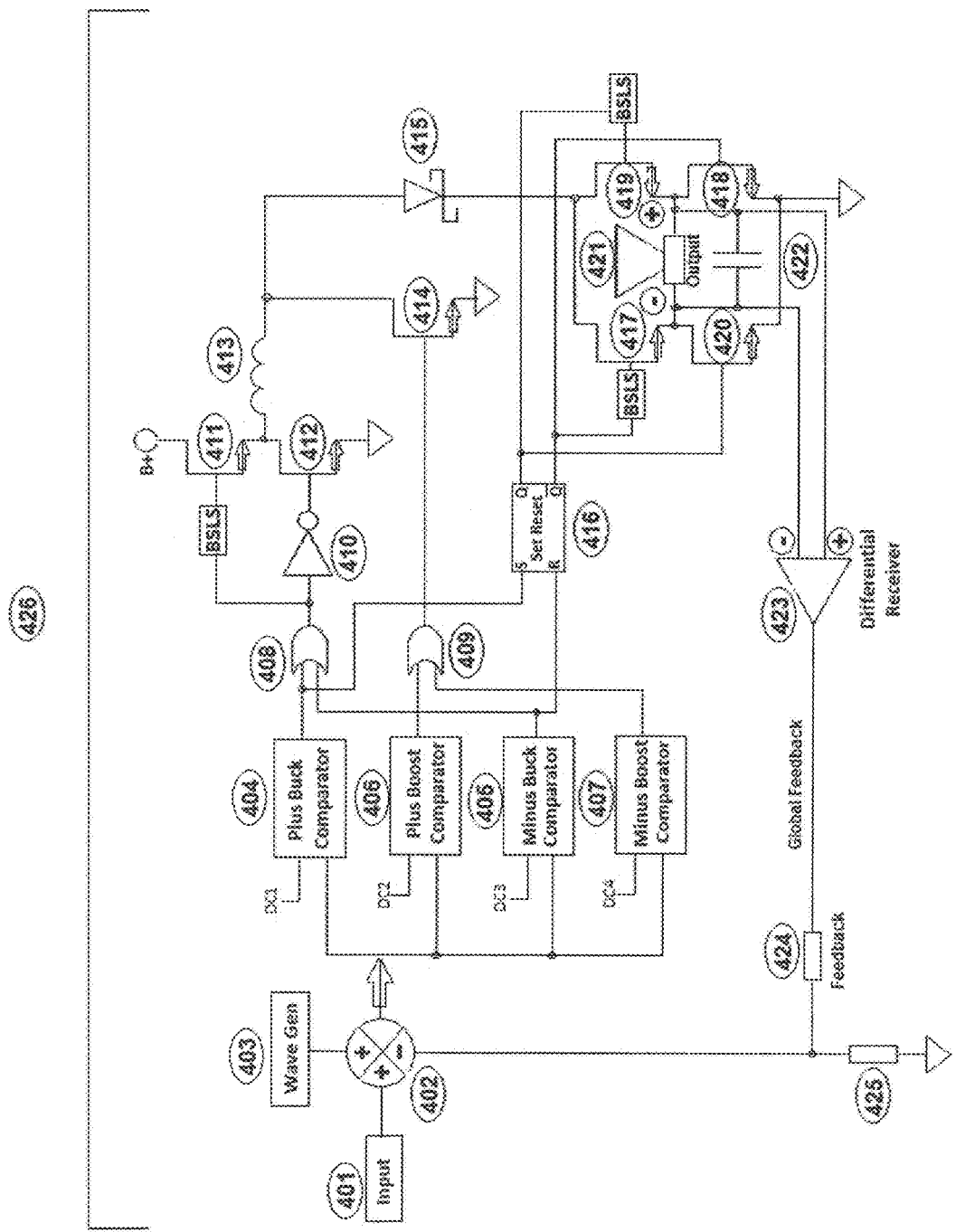
FIG. 4 is a block diagram of another embodiment of a power amplifier developed from the buck-boost regulator circuit in FIG. 3 with amplifier elements from FIG. 2, a unique architecture of the present disclosure.
Figure 9:
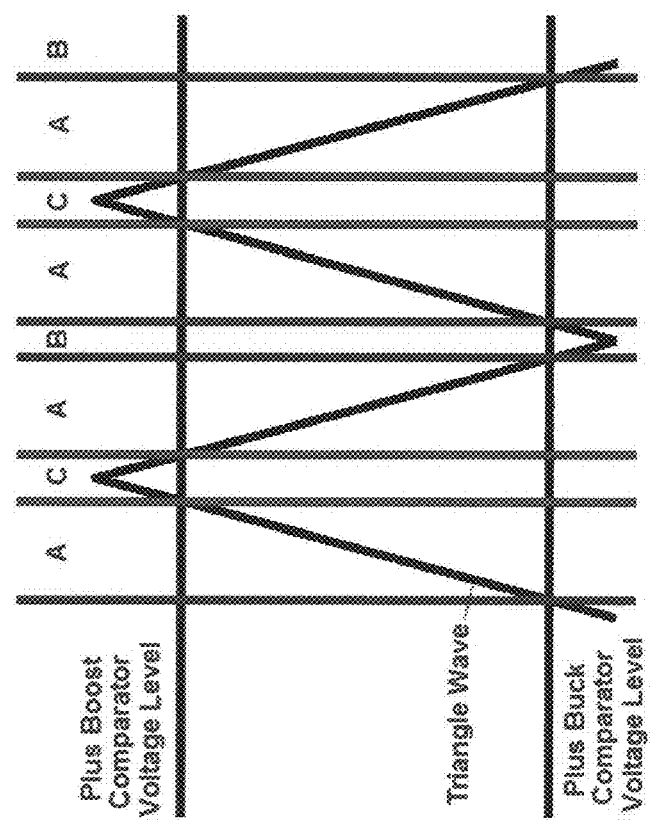
FIG. 9 is a plot showing a regulator switch status during a single cycle buck-boost regulator function, a function of the power amplifier circuit from FIG. 4.

FIG. 4 illustrates a digital switching amplifier 426 that employs the switching regulator in FIG. 3 and builds upon the amplifier in FIG. 2, and is a primary architecture of the present invention. In this configuration, the input 401 is a complex wave shape such as an audio signal. The input 401, triangle wave generator 403, and a feedback signal from a differential receiver 423, reduced appropriately with feedback resistors 424 and 425, are applied to the mixer 402. The two original buck comparators 404 and 405 receive the modulated triangle wave, and with the DC1 and DC3 reference levels equidistant from the DC input level 401, comparators 404 and 405 create an amplitude dependent width pulse waveform, applied to an OR gate 408 that captures signals from both buck comparators and then applies these signals to the Combination of switches 411 and 412 through a BSLS [Boot Strap Level Shifter] and inverter 410, to provide push-pull drive to the power inductor 413 in buck mode. Standard techniques are assumed to avoid shoot-through, and adequate boot strap function (not shown). Inductor 413 is charged by switch 411, and switch 412 allows discharge. Regulator function output is applied from the inductor 413 through power diode 415 to the four-switch output steering combination 417-420. Power diode 415 is used in order to prevent the discharged inductor from loading the output capacitor 422 in DCM. This diode function can be emulated with a switch that is made to perform similarly with reduced voltage drop and power loss. The buck comparators have DC references DC1 and DC3 equidistant from the DC input level 401. The buck comparator DC levels are sized to be a bit smaller than the effective amplitude of the triangle wave so that a low duty cycle, amplitude dependent width pulse waveform is generated at low input amplitudes to ensure linearity around zero crossing output levels [See FIG. 7]. Two more comparators are added to support boost mode with DC input voltage levels DC2 and DC4. These DC switch points are also equidistant from the DC input level. The DC2 and DC4 levels are designed to track with the power source voltage but at a slightly reduced equivalent level to ensure smooth switch transition from buck to buck-boost. The mixer 402 output is applied to all four comparators 404-407. A BSLS [Boot Strap Level Shifter] interface ensures all high side N-channel FETs achieve adequate gate ON voltages when applied. An added OR gate 409 is used to provide the signal output from either boost comparator to a new boost N-channel FET 414 that can further charge inductor 413 when switched ON while switch 411 is ON, allowing for supply and output levels above the B+ power source voltage. The nature of the triangle wave and comparator levels ensure that switch 411 will always be ON when boost FET 414 is activated [See FIG. 9]. Buck comparator signals are also applied to the Set-Reset latch element 416 that determines which polarity of provided regulator output pulse is applied to the output terminals through the amplifier output stage comprised of four FETs 417-420. These are activated by the Set-Reset signals alternately in pairs to complete the current path to ground with the correct polarity. N-channel FETs 419 and 420 are set to ON with N-channel FETs 417 and 418 set to OFF for a positive pulse current delivery, and the opposite for negative current. These switch settings steer the correct current polarity to the output terminals and load 421 and the capacitor 422.

Figure 5:
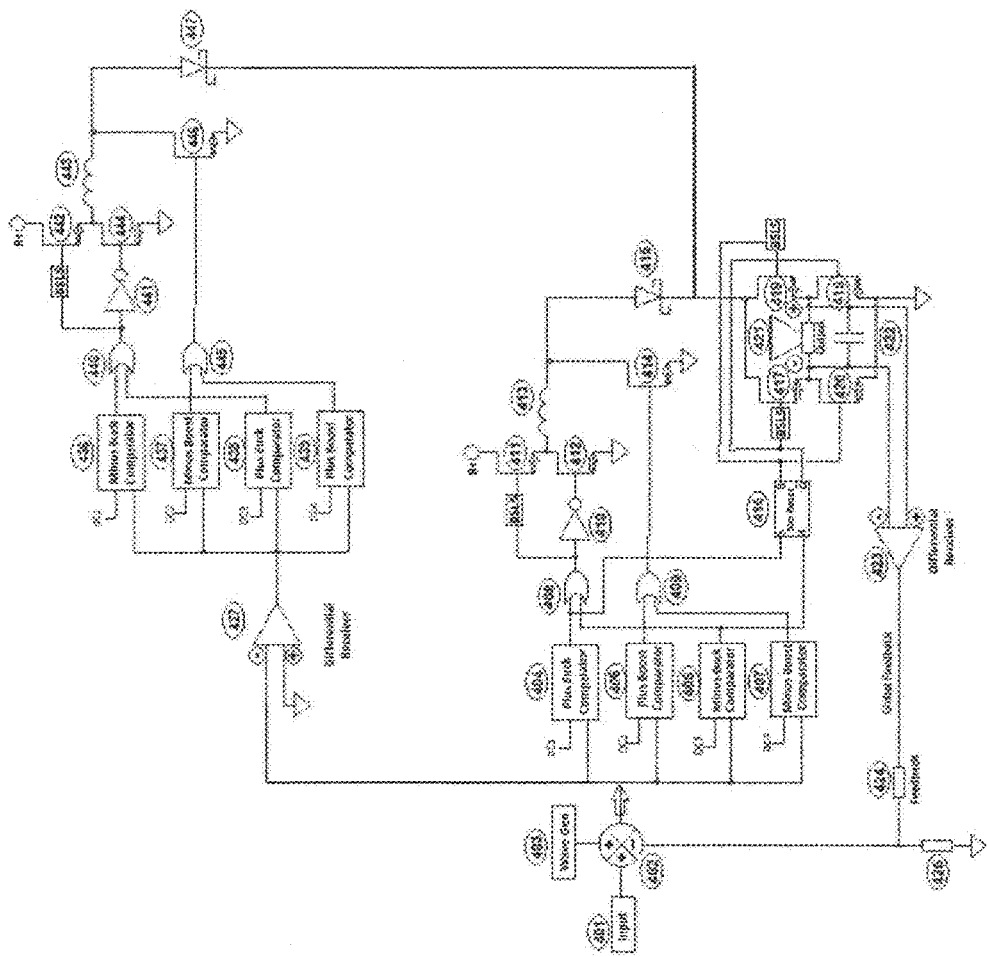
FIG. 5 is a block diagram of a dual phase configuration for reduced ripple and high power.
Figure 6:
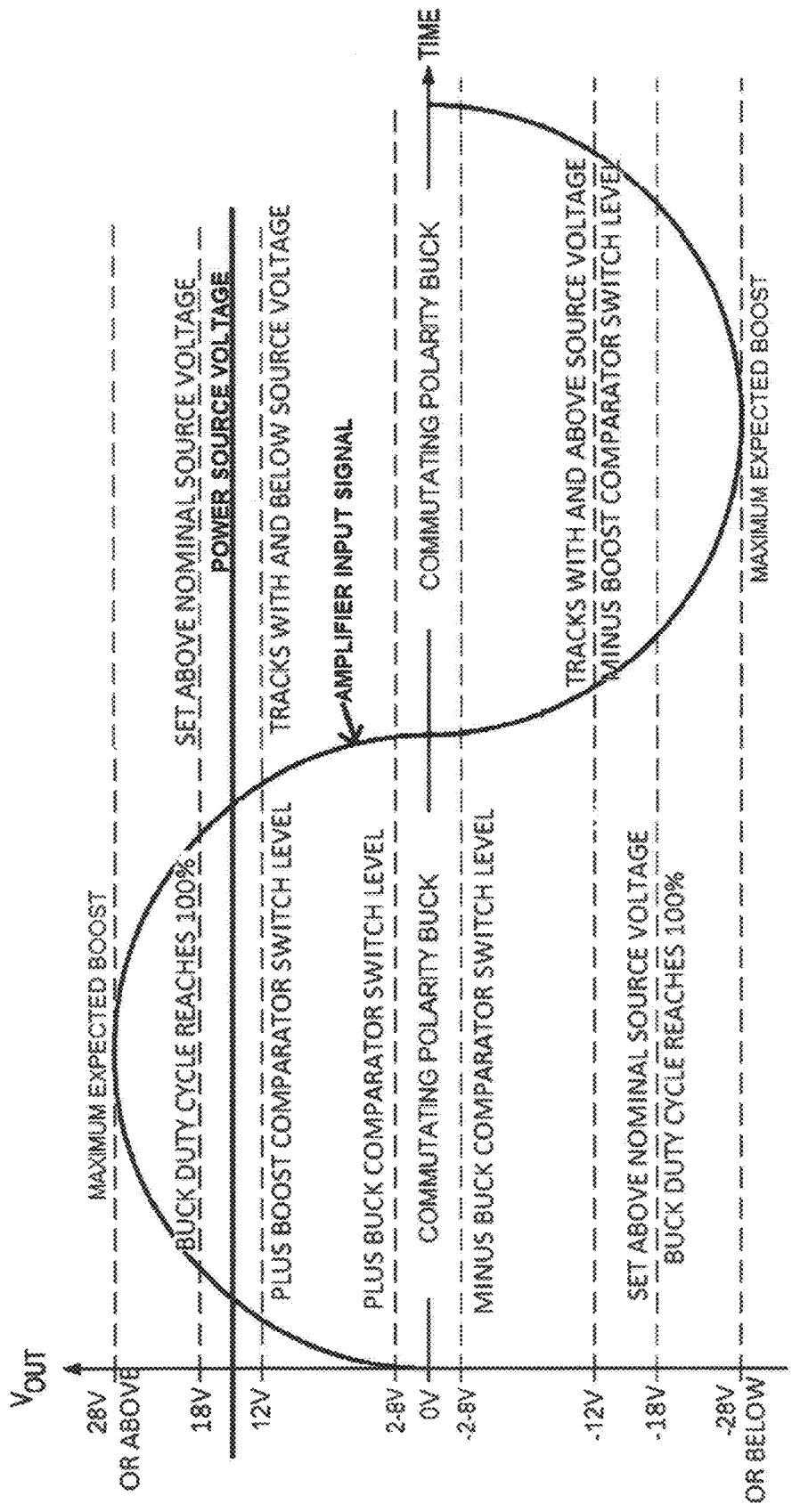
FIG. 6 is a plot showing voltage thresholds related to changes in operational characteristics of the embodiment of the power amplifier circuit from FIG. 4.

FIG. 5 shows a second inductor, buck-boost regulator switch set and comparator set which can be employed to enable two-phase regulation for enhancement of high current and reduced ripple by providing the mixed signals to an inverter amplifier with output to the new comparator set. Plus and minus comparators may swap places while keeping the DC reference inputs the same. Power diodes 415 and 447 from each regulator architecture may be cathode connected to a common output polarity steering stage. More phases can be added with the use of multiple delayed triangle waves injected to multiple input mixers that each mix the input and feedback signal with the delayed triangle waves with duplicate comparator sets linked to switch elements as in FIG. 4 and linking output diode cathodes.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. An audio power amplifier arrangement, comprised of:
   a buck regulator based system that includes:
      a connection to a DC power source;
      two N-channel FET switches arranged to operate as a buck regulator, in combination, with one switch connected to the DC power source, the two switches connected together and connected to one end of a power inductor, with the other switch connected to ground;
      a power diode or N-channel FET switch configured to emulate the function of an independent power diode, but with less voltage drop and power dissipation, with an anode connected to an other end of the power inductor;
      an output polarity steering set of four electronic N-channel FET switches connected to a cathode of the power diode;
      a capacitor coupled across output terminals;
      a modulator architecture that includes:
         an input configured to receive an input signal;
         a triangle wave oscillator;
         a differential receiver with its input connected to the output terminals;
         a signal mixer that mixes the input signal with an output of the differential receiver and an output of the triangle wave oscillator and feeds the mix to a pair of comparators with different DC set point inputs, outputs of the comparators being received by an OR gate, an output of the OR gate being connected to two electronic switches, the two electronic switches including a first electronic switch having a first terminal connected to a power source, and a second terminal connected to the OR gate through a bootstrap level shifter, the two electronic switches including a second electronic switch having a first terminal connected to ground, and a second terminal connected to the OR gate through a logic inverter, each of the first electronic switch and the second electronic switch including a respective third terminal, the two third terminals being connected to each other.

2. The arrangement of claim 1, wherein each of the first electronic switch and the second electronic switch includes a respective N-channel FET, a boost function being added to the buck amplifier architecture with the addition of two more boost comparators, DC set points and an OR gate supporting an-N-channel FET boost switch tied to an inductor so as to increase the current in the inductor when needed.

3. The arrangement of claim 2, wherein the comparator, switch, inductor and control logic regulator elements are duplicated with a signal input from the existing mixer output to an inverter, then applied to new comparators, the output diode cathodes being connected to increase current and reduce ripple to realize a two-phase multi-phase converter.

4. The arrangement of claim 2, wherein the DC voltages applied to buck comparators are set apart from the DC bias point of the input signal at levels slightly smaller than the peak to peak amplitude of the output of the triangle wave oscillator so as to work with the output of the triangle wave oscillator to emulate low duty cycle class A-D amplifier modulation in the output polarity steering switches when coupled to the DC regulator architecture.

5. The arrangement of claim 2, wherein the DC voltages applied to the boost regulators are placed so as to track with the equivalent gain reduced power source at absolute magnitude that is slightly less than that equivalent source voltage so as to aid in smooth transition from buck switching to buck-boost switching.

6. The arrangement of claim 2, wherein a current sensing element is connected in series with the output load, and the current signal is mixed with the input to realize positive current feedback, creating a zero, negative, or frequency-dependent amplifier output impedance.

7. The arrangement of claim 6, further comprising a differential feedback amplifier including a signal chain that has filtering to reduce digital artifacts.

8. The arrangement of claim 6, wherein the amplifier architecture can emulate the action of a single cycle husk-boost regulator.

9. The arrangement of claim 6, wherein the regulator power output diode is emulated with a FET switch working with a current sensing circuit in order to reduce power loss.

10. The arrangement of claim 6, wherein the input voltage signal is indicative of a target voltage plus gain for the output voltage.

11. The arrangement of claim 6, wherein all high side FETs are supported with boot strap level shifting gate signal conditioners.

12. The arrangement of claim 6, wherein capacitors may be tied from output terminals to ground to minimize electromagnetic interference.

13. The arrangement of claim 6, wherein the OR gate, inverter and Set-Reset latch element are all emulated with a hex NOR gate.

14. The arrangement of claim 6, wherein the arrangement is in the form of a monolithic semiconductor device.

15. The arrangement of claim 6, wherein the output load includes an acoustic transducer.

16. The arrangement of claim 6, wherein multiple phase regulation is realized by duplicating the control architecture, power devices, and inductor with use of phase shifted triangle waves, lashing diode cathodes together for more current and less ripple.

17. The arrangement of claim 6, wherein the arrangement includes bipolar junction transistor power devices.

18. The arrangement of claim 6, wherein P-channel FETs are used to realize the power devices.

19. The arrangement of claim 6, wherein IGBTs [Insulated Gate Bipolar Transistors] are used to realize the power devices.

20. The arrangement of claim 6, wherein discrete transistors are used to realize the logic elements.

21. The arrangement of claim 6, wherein operational amplifiers are used to realize the comparators.

22. The arrangement of claim 6, wherein a negative power source is used.

23. The arrangement of claim 6, wherein one or more saw tooth (asymmetric triangle) waves with one or more mixers connected to one or more comparators are used, instead of a symmetric triangle wave and comparators.

24. The arrangement of claim 6, wherein any arbitrary wave shape with one or more mixers connected to one or more comparators are used, instead of a symmetric triangle waves in order to optimize total harmonic distortion.

25. The arrangement of claim 6, wherein a diode is used in place of an active switch in the ground leg of the push-pull buck drive.

26. The arrangement of claim 6, wherein window comparators are used.

27. The arrangement of claim 6, wherein comparators with [Q] plus and [Q'] minus outputs are used to replace or rearrange logic elements.

28. The arrangement of claim 6, wherein current limited or otherwise controlled FETs are used.

29. The arrangement of claim 6, wherein SiC [Silicon Carbide] power FETs are used.

30. The arrangement of claim 6, wherein GaN [Gallium Nitride] power FETs are used.

31. The arrangement of claim 6, wherein the input voltage signal is an audio signal.

32. The arrangement of claim 6, wherein multiple resistors, capacitors and inductors may be applied at different locations to control electromagnetic compatibility (EMC).

33. The arrangement of claim 6, wherein common techniques are employed to minimize shoot through in inductor driver components.

34. The arrangement of claim 6, wherein a current sensing component is added between the output H-bridge and ground in order to work as a current limit or shutdown function.

35. The arrangement of claim 6, wherein DC sensing is added to the output terminals in order to detect and shut down the amplifier if continuous DC is detected at the output.

* * * * *